United States Patent
Griesbaum et al.

(10) Patent No.: US 9,537,500 B2
(45) Date of Patent: Jan. 3, 2017

(54) INPUT CIRCUIT FOR PROCESSING AN ANALOG INPUT SIGNAL IN THE FORM OF AN ANALOG MEASUREMENT SIGNAL WITH A MODULATED ADDITIONAL SIGNAL AND METHOD FOR OPERATING SUCH AN INPUT CIRCUIT

(71) Applicant: SIEMENS AKTIENGESELLSCHAFT, München (DE)

(72) Inventors: Wilhelm Griesbaum, Kandel (DE); Simon Heck, Rheinstetten (DE); Eberhard Schlarb, Gundelfingen (DE)

(73) Assignee: SIEMENS AKTIENGESELLSCHAFT (DE)

( * ) Notice: Subject to any disclaimer, the term of this patent is extended or adjusted under 35 U.S.C. 154(b) by 0 days.

(21) Appl. No.: 14/727,983

(22) Filed: Jun. 2, 2015

(65) Prior Publication Data
US 2015/0358028 A1   Dec. 10, 2015

(30) Foreign Application Priority Data
Jun. 4, 2014   (DE) .................. 10 2014 210 660

(51) Int. Cl.
H03M 1/12 (2006.01)
H03M 1/56 (2006.01)
H03M 1/60 (2006.01)

(52) U.S. Cl.
CPC ................. H03M 1/12 (2013.01); H03M 1/56 (2013.01); H03M 1/60 (2013.01)

(58) Field of Classification Search
CPC .................................... H03M 1/00; H03M 1/12
USPC ......................................................... 341/155
See application file for complete search history.

(56) References Cited

U.S. PATENT DOCUMENTS 4,523,180 A * 6/1985 Kuboki .................. H03M 1/00
341/148

* cited by examiner

*Primary Examiner* — Jean B Jeanglaude
(74) *Attorney, Agent, or Firm* — Schmeiser, Olsen & Watts LLP

(57) ABSTRACT

An input circuit for processing an analog input signal in the form of an analog measurement signal with a modulated additional signal and for converting the input signal into a serial bit stream having a frequency distribution of high levels which is proportional to the input signal, and a method for operating such an input circuit, the input circuit including a device for comparing an instantaneous voltage value of the input signal with a variable comparison value and a device for adapting the comparison value to an instantaneous value of the generated bit stream, is provided.

13 Claims, 2 Drawing Sheets

INPUT CIRCUIT FOR PROCESSING AN ANALOG INPUT SIGNAL IN THE FORM OF AN ANALOG MEASUREMENT SIGNAL WITH A MODULATED ADDITIONAL SIGNAL AND METHOD FOR OPERATING SUCH AN INPUT CIRCUIT

CROSS-REFERENCE TO RELATED APPLICATIONS

This application claims priority DE 102014210660.5, having a filing date of Jun. 4, 2014, the entire contents of which are hereby incorporated by reference.

FIELD OF TECHNOLOGY

The following relates to an analog/digital converter circuit (referred to as an input circuit below for short) for processing an analog input signal in the form of an analog measurement signal with a modulated additional signal, in particular such an input circuit having integrated demodulation of the modulated additional signal, for example an additional signal in the form of a HART signal, and therefore having integrated HART demodulation.

BACKGROUND

Such input circuits are known and by now have many measuring transducers and actuators which are connected, via a 4-20 mA interface, to analog detection and output assemblies via an integrated HART interface. This results in the need to both digitize the actual measured value, which is transmitted by means of the 4-20 mA current, using analog/digital conversion and to demodulate the HART signal modulated onto this current and to receive the message transmitted thereby.

The illustration in FIG. 1 shows such an input circuit.

It can be seen that such a known input circuit is comparatively complicated since it comprises an analog/digital converter, a bandpass filter and a HART demodulator.

SUMMARY

An aspect relates to specifying a further embodiment of an analog input circuit with integrated HART demodulation, in particular such an input circuit which has a simpler construction and can therefore be produced in a more cost-effective manner. A further aspect specifies a method for operating such an analog input circuit.

With respect to the apparatus aspect, this aspect is achieved, with an analog input circuit as disclosed hereinafter. For this purpose, in an analog input circuit which is sometimes also referred to only as an input circuit for short below and is intended and set up to process an analog input signal in the form of an analog measurement signal with a modulated additional signal and to convert the input signal into a serial bit stream having a frequency distribution of high levels which is proportional to the input signal and therefore also to the measurement signal, provision is made for the input circuit to comprise means for comparing an instantaneous voltage value of the input signal with a variable comparison value and means for adapting the comparison value to an instantaneous value of the generated bit stream.

The advantage of such an input circuit is that, instead of the previously required units of the analog/digital converter, bandpass filter and demodulator, in particular HART demodulator, the input circuit requires only the means for comparing the instantaneous voltage value of the input signal with the variable comparison value and the means for adapting the comparison value to an instantaneous value of the generated bit stream.

In one particular embodiment of the input circuit, a comparator acts as the means for comparing the respective instantaneous voltage value of the input signal with the variable comparison value.

In another particular embodiment of the input circuit, a D-type flip-flop, at the output of which the respectively generated bit stream is output, and a resistor connecting the output of the D-type flip-flop to one of the inputs of the comparator act as the means for adapting the comparison value to a respective instantaneous value of the generated bit stream.

With respect to the method, the abovementioned aspect is achieved, according to the embodiments of the invention, by the features of the parallel method claim. According thereto, in a method for operating an input circuit of the type described here and below, provision is made for a respective instantaneous voltage value of the input signal to be compared with a variable comparison value provided by the input circuit, for the comparison value to be adapted to an instantaneous value of the generated bit stream, and for the input signal to be converted, together with the modulated additional signal included in the input signal, into a serial bit stream having a frequency distribution of high levels which is proportional to the input signal.

The subclaims relate to advantageous configurations of the invention. Dependency references used here indicate the further embodiment of the subject matter of the main claim by means of the features of the respective subclaim. They should not be understood as dispensing with the attainment of independent substantive protection for the combinations of features in the dependent subclaims. Furthermore, with regard to interpreting the claims in the case of more specific concretization of a feature in a subordinate claim, it should be assumed that such a restriction is not present in the respective preceding claims. Finally, it should be pointed out that the method stated here can also be developed according to the dependent apparatus claims and vice versa.

In one particular embodiment of an input circuit in which a comparator acts as the means for comparing the respective instantaneous voltage value of the input signal with the variable comparison value, the input signal is able to be supplied to a first input of the comparator, a capacitor being connected to a second input of the comparator and an electrical voltage across the capacitor acting as the comparison value, and the input circuit comprising a D-type flip-flop and a resistor connected between an output of the D-type flip-flop and the capacitor as the means for adapting the comparison value to an instantaneous value of the generated bit stream.

The capacitor acts as a charge store and the voltage across the capacitor acts as the comparison value. The respective state of charge of the capacitor and therefore the comparison value are dependent, via the resistor connected to the output of the D-type flip-flop, on the respectively generated bit stream, namely the instantaneous value of the respectively generated level of the bit stream. This is a way of generating a bit stream having a frequency distribution of high and low levels, which is proportional to the input signal and to the measurement signal included in the latter, which is particularly simple to implement in terms of circuitry and is nevertheless efficient.

In another particular embodiment of the input circuit, the latter comprises a processing unit and a machine implemented as a functionality of the processing unit, the serial bit stream being able to be supplied to the processing unit and the frequency distribution of the high and/or low levels in the bit stream being able to be determined using the machine. Such a processing unit, for example a processing unit in the form of a so-called FPGA, is a comparatively simple but, in particular, efficient possible way of implementing a functionality/a machine for determining the frequency distribution of the high and/or low levels in the bit stream. Such a functionality may also fundamentally have a discrete structure, for example with substantially two counters, one of the two counters counting the high and/or low levels in the bit stream until the other counter reaches a predefined threshold value or has counted down to zero starting from a predefined threshold value. The resulting counter reading of the first counter is then a measure of the frequency distribution and therefore a measure of the value of the underlying input signal and the value of the measurement signal included in the latter.

In one embodiment of the method outlined further above for operating an input circuit, provision is made, in an input circuit having a processing unit with such a machine, for the machine to comprise an implementation of a first model and a second model of the input circuit for reconstructing the input signal, for the first and second models to provide a first reconstruction result and a second reconstruction result of the input signal, and for the modulated additional signal to be determined by comparing the two reconstruction results. Such a comparison of the two reconstruction results can be carried out, for example, in the form of a subtraction of the second reconstruction result from the first reconstruction result. Overall, formation of two such reconstruction results and their subsequent comparison are a relatively simple and nevertheless efficient possible way of recovering the additional signal modulated onto the measurement signal and therefore the additional signal included in the input signal.

In another embodiment of a method for operating an input circuit having such a processing unit and such a machine, a clock signal for controlling the input circuit, in particular for clocking the D-type flip-flop, is generated using the processing unit. This has the advantage that the same clock signal can be used to control the input circuit and to clock the first and second models of the input circuit.

In yet another embodiment of the method, the average frequency distribution of high or low levels in the bit stream during a period of time corresponding to a duration of a mains period is determined using the machine. This has the advantage that possible mains humming is eliminated and an input circuit operating according to this method acts like an input circuit having a mains filter without comprising such a mains filter as a specific component.

The input circuit presented here and the method presented here for operating such an input circuit come into consideration, in particular, for analog input signals in which the modulated additional signal is a HART signal.

Overall, embodiments of the invention is also an automation device having an input circuit as described here and below or having an input circuit operating according to the method described here and below, that is to say for example an automation device in the form of an analog input assembly having at least one analog input and at least one such input circuit for the at least one analog input or in the form of a digital/analog input assembly likewise having at least one such input circuit for the at least one analog input included in such an assembly.

One exemplary embodiment of the invention is explained in more detail below using the drawing. Items or elements corresponding to one another are provided with the same reference symbols in all figures.

The, or each exemplary embodiment should not be understood to restrict the invention. Rather, additions and modifications are also thoroughly possible within the scope of the present disclosure, particularly those which can be gathered by a person skilled in the art with regard to the achievement of the aspect for example by combining or modifying individual features or method steps which are described in connection with the general or specific part of the description and which are contained in the claims and/or the drawing, and which, through combinable features, result in a novel subject matter or in novel method steps or sequences of method steps.

BRIEF DESCRIPTION

Some of the embodiments will be described in detail, with reference to the following figures, wherein like designations denote like members, wherein.

DETAILED DESCRIPTION

Figure 1:
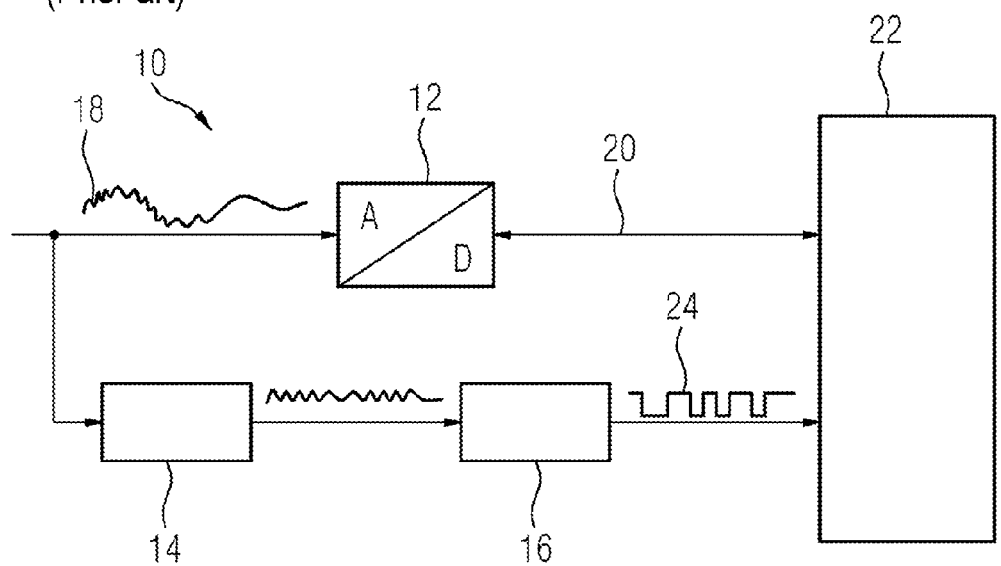
FIG. 1 shows a known analog input circuit.

The illustration in FIG. 1 shows a basic illustration of an analog input circuit 10 known in the prior art with integrated HART demodulation in schematically simplified form. The analog input circuit 10 which is sometimes also referred to below only as an input circuit 10 for short comprises an analog/digital converter (A/D converter) 12, a bandpass filter 14 and a HART demodulator 16.

An input signal 18 in the form of an analog measurement signal with a modulated additional signal, for example a HART signal, which is recorded using the input circuit 10 is converted into a digital value using the A/D converter 12 and this value is transmitted for further processing, for example in the form of an actual control value, by means of a serial or parallel connection (serial or parallel transmission path 20) to a processing unit 22 in the form of a microcontroller, an FPGA, an ASIC or the like.

In a parallel manner, the input signal 18 is supplied to the bandpass filter 14 which filters the modulated HART signal from the input signal 18. The output of the bandpass filter 14 is converted into a digital HART message 24 using the HART demodulator 16 and this message is likewise supplied to the processing unit 22.

In the interests of better readability of the description, the description is continued below using the example of a modulated HART signal as the additional signal but without dispensing with further generality.

Figure 2:
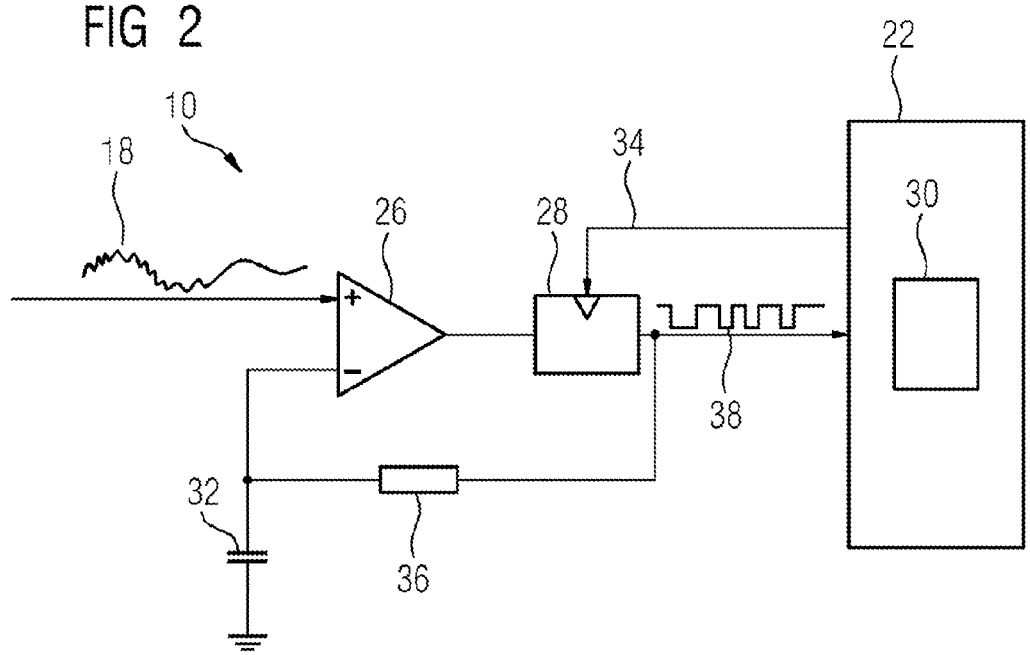
FIG. 2 shows an analog input circuit according to the approach proposed here.

The illustration in FIG. 2 shows an embodiment of an input circuit 10 of the type proposed here. This input circuit 10 does not comprise an A/D converter 12 (FIG. 1), a bandpass filter 14 (FIG. 1) or a demodulator either, in particular a HART demodulator 16 (FIG. 1). These previously required functional units are replaced with a comparator 26, a D-type flip-flop 28 clocked at a high frequency and a machine 30 included in the processing unit 22.

The comparator 26 compares the voltage of a capacitor 32 connected to ground with the respective voltage value of the input signal 18. A respectively resulting output signal from the comparator 26 is passed to the data input (usually referred to as the D input) of the D-type flip-flop 28 clocked at a high frequency. In order to clock the D-type flip-flop 28 at a high frequency, the processing unit 22 generates a clock signal 34 with a clock period of one microsecond, for example. The clock signal 34 is supplied to the clock input of the D-type flip-flop 28. An output of the D-type flip-flop 28 is fed back to the capacitor 32 via a resistor 36.

Given a suitable choice of the clock frequency of the clock signal 34 and the resistor and capacitor values and with a precise voltage supply to the D-type flip-flop 28, for example in such a manner that the high and low levels generated correspond to voltage values of +5 V and 0 V, this input circuit 10 produces a bit stream 38, from whose relative frequency distribution of the intervals of ones both the exact mean value of the input signal 18 in a respectively considered period of time and the frequencies of the modulated HART signal can be derived. This is carried out using the machine 30 implemented as a functionality of the processing unit 22. In this case, intervals of ones are understood as meaning all high levels detected when sampling the bit stream 38 at the clock rate of the clock signal 34.

In this respect, the generation of the bit stream 38 using the comparator 26 and the D-type flip-flop 28 is first of all explained here. In this case, it is assumed that the capacitor 32 is initially not charged or has only a low initial charge and that the analog input signal 18—for the purpose of simplifying the description—has a largely constant value of 2.5 V, for example. The comparator 26 compares the instantaneous voltage value of the input signal (that is to say 2.5 V, for example) with the voltage across the capacitor 32 which is low according to the assumption and is therefore at least below 2.5 V. A logic one accordingly appears at the output of the comparator 26, which logic one is switched through to the output of the D-type flip-flop 28 by the D-type flip-flop 28 with a rising edge of the clock signal 34. On account of the precise voltage supply to the D-type flip-flop 28, this logic one corresponds to a voltage level of 5 V, for example, with the result that the capacitor 32 is charged with this voltage. This charging operation occurs during the subsequent periods of the clock signal 34 until the voltage across the capacitor 32 has reached a value above the instantaneous voltage value of the input signal 18, that is to say a value above 2.5 V here according to the assumption. In this situation, the comparison of the two input voltages applied to the comparator 26 results in a logic zero at the output of the comparator 26, which logic zero appears at the output of the D-type flip-flop 28 with the next rising edge of the clock signal 34 and corresponds to a voltage level of 0 V. The capacitor 32 is therefore—at least briefly—discharged. The voltage across the capacitor 32 therefore falls and a situation occurs again, for example, in which a logic one appears at the output of the comparator on account of the comparison of the two input signals of the comparator 26, which logic one briefly results in the capacitor 32 being charged again. This in turn results in a logic zero appearing at the output of the comparator on account of the comparison of the two input signals of the comparator 26, which logic zero results in the capacitor 32 being discharged, etc. As a result, the bit stream 38 oscillates between a high level and a low level and, on the basis of a uniform distribution or an at least approximate uniform distribution of the high and low levels (the logic ones and zeros), the machine 30 can be used to infer the voltage value of the input signal 18, namely 2.5 V as the mean value between the voltage level of the high signal (5 V) of the bit stream 38, which is possibly used to charge the capacitor 32, and the voltage level of the low signal (0 V) of the bit stream 38, which is possibly used to discharge the capacitor 32.

In the case of a different voltage value of the input signal 18, for example 4 V, different conditions and a different distribution of the logic ones and zeros in the bit stream 38 result. The capacitor 32 is initially charged as described above. As soon as the voltage across the capacitor 32 exceeds the instantaneous value of the voltage of the input signal 18 for the first time, a logic zero appears at the output of the comparator 26, which logic zero appears at the output of the D-type flip-flop 28 as a 0-V level in the bit stream 38 with the next rising edge of the clock signal 34. The capacitor 32 is therefore discharged. The discharging is carried out using a discharge current across the resistor 36 corresponding to the voltage difference between the instantaneous voltage level of the bit stream 38 (0 V) and the instantaneous value of the voltage across the capacitor 32 (approximately 4 V). With a clock period of the clock signal 34 of one microsecond, for example, the capacitor 32 is therefore discharged to an order of magnitude of 4 µV. If this discharging (during one clock period) already suffices for a logic one to then appear at the output of the comparator on account of the comparison of the two input signals of the comparator 26, this logic one is clocked through to the output of the D-type flip-flop 28 with the next rising edge of the clock signal 34, with the result that a voltage level of the bit stream 38 of 5 V accordingly results. The capacitor 32 is now charged again using the voltage difference across the resistor 36 (5 V minus approximately 4 V). With a clock period of the clock signal 34 of one microsecond, the capacitor 32 is therefore charged to an order of magnitude of 1 µV during one clock period. For an assumed voltage value of the input signal 18 of 4 V, compensation for previous discharging of the capacitor 32 therefore lasts approximately four times as long as the previous discharging. A distribution of the ones and zeros in the bit stream 38 accordingly also results. The conditions outlined above accordingly apply to other voltage values of the input signal 18 and the result is a distribution of the ones and zeros in the bit stream 38, which is respectively proportional to the instantaneous value of the voltage of the input signal 18, and therefore also such a distribution which is proportional to the instantaneous value of the voltage of the measurement signal contained in the input signal 18.

The frequency distribution of the "ones" (the logic high levels) in the bit stream 38 is evaluated using the machine 30. In this case, the ones in the bit stream 38 are counted, for example, during a period of time of twenty milliseconds, that is to say the duration of a full wave of a 50 Hz oscillation. This period of time and formation of a mean value over this period of time have the advantage that possible mains humming is averaged out at a mains frequency of likewise 50 Hz since both the positive and the negative half-wave of the mains frequency are taken into account in the case of mains humming, with the result that the influences of possible mains humming are compensated for over the entire duration of the period of time under consideration. Such evaluation of the bit stream 38 therefore acts like a mains filter and renders a separate mains filter superfluous.

Figure 3:
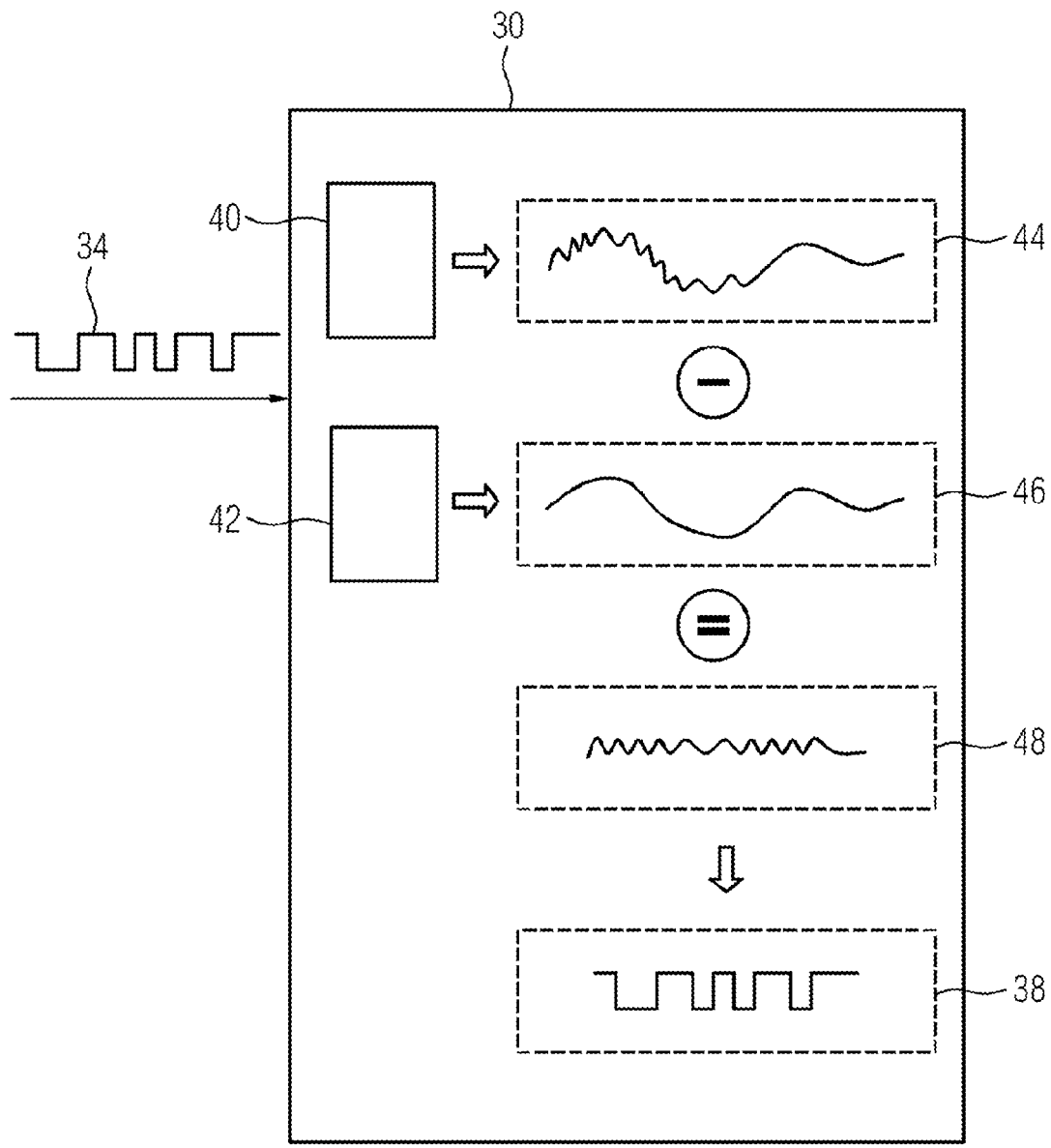
FIG. 3 shows an illustration of a machine for evaluating a bit stream generated by an analog input circuit according to FIG. 2.

The derivation of the frequencies of the HART signal modulated onto the measurement signal on which the input signal 18 is based using the machine 30 is finally explained using the illustration in FIG. 3. The machine 30 acts as a means for reconstructing the original input signal 18 from the bit stream 38 supplied to it at the input of the processing unit 22 and has an appropriate design. For this purpose, the machine 30 comprises a first model 40 and a second model 42 of the input circuit 10. The two models 40, 42 are suitably programmed functional structures of the processing unit 22. The programming of such functional structures is fundamentally known per se and is carried out, for example, in an FPGA acting as a processing unit 22 using a hardware description language (HDL), for example VHDL.

Each model 40, 42 provides a reconstruction of the input signal 18. The result of a reconstruction of the input signal 18 on the basis of the first model 40 of the input circuit 10 (FIG. 2) is a first reconstruction result 44. In this case, the first model 40 is designed for the most accurate possible reconstruction of the input signal 18, that is to say the measurement signal together with the modulated HART signal. The result of a reconstruction of the input signal 18 on the basis of the second model 42 of the input circuit 10 (FIG. 2) is accordingly a second reconstruction result 46. In this case, the second model 42 is designed for reconstruction of the measurement signal contained in the input signal 18, that is to say the input signal 18 without the modulated HART signal.

For this purpose, the first model 40 is operated using the characteristics of the components actually included in the input circuit 10 and the resulting time constant of the series circuit comprising the resistor 36 and the capacitor 32 which can also be interpreted as an RC element. In contrast, the second model 42 is operated with a time constant which is greater than that of the first model 40, for example by adapting the modeled characteristics of the resistor 36 and/or the capacitor 32.

A difference between the two reconstruction results 44, 46 produces, as the third reconstruction result 48, the modulated HART signal contained in the input signal 18. The underlying digital HART message 24 can be obtained therefrom using a demodulator implemented as part of the functionality of the machine 30.

Although the invention has been described and illustrated more specifically in detail by the exemplary embodiment, the invention is not restricted by the example(s) disclosed and other variations can be derived therefrom by a person skilled in the art without departing from the scope of protection of the invention.

Individual salient aspects of the description submitted here can be briefly summarized as follows: the invention states an input circuit 10 for processing an analog input signal 18 in the form of an analog measurement signal with a modulated additional signal and for converting the input signal 18 into a serial bit stream 38 having a frequency distribution of high levels which is proportional to the input signal 18, the input circuit 10 comprising means 26 for comparing an instantaneous voltage value of the input signal 18 with a variable comparison value and means 28, 36 for adapting the comparison value to an instantaneous value of the generated bit stream 38. A method for operating such an input circuit 10 is also stated.

LIST OF REFERENCE SYMBOLS

10 Analog input circuit/input circuit
12 A/D converter
14 Bandpass filter
16 HART demodulator
18 Input signal
20 Serial or parallel transmission path
22 Processing unit
24 HART message
26 Comparator
28 D-type flip-flop
30 Machine
32 Capacitor
34 Clock signal
36 Resistor
38 Bit stream
40 First model
42 Second model
44 First reconstruction result
46 Second reconstruction result
48 Third reconstruction result

The invention claimed is:

1. An input circuit for processing an analog input signal in the form of an analog measurement signal with a modulated additional signal and for converting the input signal into a serial bit stream having a frequency distribution of high levels which is proportional to the input signal, the input circuit comprising:
   a device for comparing an instantaneous voltage value of the input signal with a variable comparison value and a device for adapting the variable comparison value to an instantaneous value of the generated bit stream.

2. The input circuit as claimed in claim 1, having a comparator as the device for comparing the respective instantaneous voltage value of the input signal with the variable comparison value.

3. The input circuit as claimed in claim 2, wherein
   the input signal being able to be supplied to a first input of the comparator,
   a capacitor being connected to a second input of the comparator and an electrical voltage across the capacitor acting as the comparison value, and
   the input circuit comprising a D-type flip-flop and a resistor connected between an output of the D-type flip-flop and the capacitor as the device for adapting the comparison value to an instantaneous value of the generated bit stream.

4. The input circuit as claimed in claim 1, further comprising a processing unit and a machine implemented as a functionality of the processing unit, the serial bit stream being able to be supplied to the processing unit and the frequency distribution of the high levels in the bit stream being able to be determined using the machine.

5. A method for operating an input circuit comprising:
   providing a device for comparing an instantaneous voltage value of an input signal with a variable comparison value,
   providing a device for adapting the variable comparison value to an instantaneous value of a generated bit stream,
   comparing the respective instantaneous voltage value of the input signal with the variable comparison value provided by the input circuit,
   the comparison value being adapted to the instantaneous value of a generated bit stream, and
   converting the input signal, together with the modulated additional signal included in the input signal, into a serial bit stream having a frequency distribution of high levels which is proportional to the input signal.

6. A method for operating an input circuit as claimed in claim 5 further comprising:
   implementing a first model and a second model of the input circuit for reconstructing the input signal, the first and second models providing a first reconstruction result and a second reconstruction result of the input signal, and the additional signal modulated onto the measurement signal on which the input signal is based being determined by comparing the two reconstruction results.

7. A method for operating an input circuit as claimed in claim 5 further comprising:
providing a clock signal for controlling the input circuit being generated using the processing unit.

8. A method for operating an input circuit as claimed in claim 5 further comprising:
determining an average frequency distribution of high levels in the bit stream during a period of time corresponding to a duration of a mains period using the machine.

9. The method as claimed in claim 5 further comprising, the additional signal modulated onto the measurement signal on which the analog input signal is based being a HART signal.

10. An automation device comprising:
an input circuit having a device for comparing an instantaneous voltage value of an input signal with a variable comparison value and a device for adapting the variable comparison value to an instantaneous value of a generated bit stream.

11. The automation device as claimed in claim 10, having a comparator as the device for comparing the respective instantaneous voltage value of the input signal with the variable comparison value.

12. The automation device as claimed in claim 11, wherein
the input signal being able to be supplied to a first input of the comparator,
a capacitor being connected to a second input of the comparator and an electrical voltage across the capacitor acting as the comparison value, and
the input circuit comprising a D-type flip-flop and a resistor connected between an output of the D-type flip-flop and the capacitor as the device for adapting the comparison value to an instantaneous value of the generated bit stream.

13. The automation device as claimed in claim 10, further comprising a processing unit and a machine implemented as a functionality of the processing unit, the serial bit stream being able to be supplied to the processing unit and the frequency distribution of the high levels in the bit stream being able to be determined using the machine.

* * * * *